(12) United States Patent
Archer et al.

(10) Patent No.: US 11,452,189 B2
(45) Date of Patent: Sep. 20, 2022

(54) EXTERNAL ZERO-CROSSING DETECTION CIRCUIT FOR LED DRIVERS

(71) Applicant: ERP POWER, LLC, Moorpark, CA (US)

(72) Inventors: Michael Archer, Moorpark, CA (US); Louis Chen, Simi Valley, CA (US)

(73) Assignee: ERP POWER, LLC, Moorpark, CA (US)

( * ) Notice: Subject to any disclaimer, the term of this patent is extended or adjusted under 35 U.S.C. 154(b) by 0 days.

(21) Appl. No.: 17/393,895

(22) Filed: Aug. 4, 2021

(65) Prior Publication Data

US 2022/0053621 A1 Feb. 17, 2022

Related U.S. Application Data

(60) Provisional application No. 63/066,075, filed on Aug. 14, 2020.

(51) Int. Cl.
| | |
|---|---|
| *H05B 45/38* | (2020.01) |
| *H02M 1/12* | (2006.01) |
| *H02M 1/08* | (2006.01) |
| *H02M 1/42* | (2007.01) |
| *H02M 7/06* | (2006.01) |
| *H02M 7/217* | (2006.01) |
| *H05B 45/375* | (2020.01) |
| *H05B 47/105* | (2020.01) |

(52) U.S. Cl.
CPC ............ *H05B 45/38* (2020.01); *H02M 1/083* (2013.01); *H02M 1/126* (2013.01); *H02M 1/4225* (2013.01)

(58) Field of Classification Search
CPC ........ H05B 45/20; H05B 45/10; H05B 45/46; H05B 45/48; H05B 45/50
See application file for complete search history.

(56) References Cited

U.S. PATENT DOCUMENTS

| 5,757,166 | A  | * | 5/1998  | Sodhi      | H02M 1/4225 |
|           |    |   |         |            | 363/124     |
| 6,169,675 | B1 | * | 1/2001  | Shimamori  | H02M 3/285  |
|           |    |   |         |            | 363/127     |
| 6,853,563 | B1 |   | 2/2005  | Yang et al.|             |
| 7,505,287 | B1 |   | 3/2009  | Kesterson  |             |
| 2009/0015225 | A1 | * | 1/2009 | Turchi    | H02M 1/32   |
|           |    |   |         |            | 323/283     |
| 2010/0164393 | A1 | * | 7/2010 | Chang     | H05B 45/14  |
|           |    |   |         |            | 315/279     |
| 2011/0175543 | A1 | * | 7/2011 | Sun       | H05B 45/10  |
|           |    |   |         |            | 315/291     |
| 2012/0262087 | A1 | * | 10/2012| Watanabe  | H05B 45/3725|
|           |    |   |         |            | 315/291     |
| 2013/0128627 | A1 | * | 5/2013 | Moon      | H02M 3/33507|
|           |    |   |         |            | 363/21.17   |

* cited by examiner

*Primary Examiner* — Wei (Victor) Y Chan
(74) *Attorney, Agent, or Firm* — Lewis Roca Rothgerber Christie LLP (57) ABSTRACT

A zero-crossing detection circuit coupled to a power factor correction (PFC) controller of a power supply system includes a zener diode configured to generate a zener reference signal, and an operational amplifier coupled to the zener diode and configured to receive the zener reference signal and a feedback signal corresponding to an output current of the power supply system, and to generate a zero-crossing signal to a zero-crossing input of the PFC controller.

20 Claims, 4 Drawing Sheets

EXTERNAL ZERO-CROSSING DETECTION CIRCUIT FOR LED DRIVERS

CROSS-REFERENCE TO RELATED APPLICATION(S)

This application claims priority to, and the benefit of, U.S. Provisional Application No. 63/066,075 ("EXTERNAL ZERO CROSSING DETECTION CIRCUITRY, FOR WIDE RANGING, LOW POWER, DIMMABLE LED DRIVERS"), filed on Aug. 14, 2020, the entire content of which is incorporated herein by reference.

FIELD

Aspects of the present invention are related to power supply systems for light sources.

BACKGROUND

The flyback converter is a power supply topology that uses mutually coupled inductor, to store energy when current passes through the inductor and to release the energy when the power is removed. In flyback converters the primary winding of the transformer replaces the inductor while the secondary provides the output. In the flyback topology, the primary and secondary windings are used as two separate inductors.

In a closed feedback loop for an isolated driver or power supply, the sensed voltage or current measurement may be used by a power factor correction (PFC) stage to adjust the switching frequency, duty cycle, on-time, or any other modulation scheme for a DC-DC Converters located on the primary side. Generally, a PFC stage is coupled to a diode bridge rectifier at the input of the power supply and ensure that the input current is in phase with the full-wave-rectified line input voltage.

The above information disclosed in this Background section is only for enhancement of understanding of the invention, and therefore it may contain information that does not form the prior art that is already known to a person of ordinary skill in the art.

SUMMARY

Aspects of embodiments of the present invention are directed to a power supply system utilizing a zero-crossing detection circuit to variably control the off-time of a power-factor-correction (PFC) controller to improve the output operating range, while still remaining within EMC (electro-magnetic compliance) limits for power factor and total harmonic distortion. In some embodiments, the PFC controller is adjusted via the signal that is applied to the zero-crossing input of the PFC controller, which may be used to lower the frequency of the driver when it is desired to drive to lower output voltages. A signal from the zero-crossing detection circuit is injected to the zero-crossing input to have a clamp on the frequency of the driver, which allows the power supply system to have a wide-ranging output. This may also result in improved EMI performance at low power due to maintaining the frequency low with longer off-times.

According to some embodiments of the present disclosure, there is provided a zero-crossing detection circuit coupled to a power factor correction (PFC) controller of a power supply system, the zero-crossing detection circuit including: a zener diode configured to generate a zener reference signal; and an operational amplifier coupled to the zener diode and configured to receive the zener reference signal and a feedback signal corresponding to an output current of the power supply system, and to generate a zero-crossing signal to a zero-crossing input of the PFC controller.

In some embodiments, a cathode of the zener diode is coupled to a positive input terminal of the operational amplifier, and a negative input terminal of the operational amplifier is configured to receive the feedback signal.

In some embodiments, a negative input terminal of the operational amplifier is coupled to a compare input of the PFC controller.

In some embodiments, the zener diode is biased by a gate control signal output by the PFC controller, and an off-time of the gate control signal is based on the zero-crossing signal.

In some embodiments, the zener reference signal is based on a gate control signal output by the PFC controller.

In some embodiments, the zener reference signal is configured to decay in response to the PFC controller being turned off.

In some embodiments, the zero-crossing detection circuit further includes: a diode coupled between an output of the operational amplifier and the zero-crossing input of the PFC controller and configured to prevent a signal entering the zero-crossing input from being pulled down.

In some embodiments, the zero-crossing detection circuit further includes: a low-pass filter configured to filter a gate control signal output by the PFC controller and to bias the zener diode with the filtered gate control signal.

In some embodiments, the feedback signal is based on the output current of the power supply system and a brightness setting of a light source coupled to the power supply system.

According to some embodiments of the present disclosure, there is provided a power supply system including: a power factor correction (PFC) controller including a zero-crossing input, and configured to generate a gate control signal based on a zero-crossing signal received at the zero-crossing input; and a zero-crossing detection circuit coupled to the PFC controller, the zero-crossing detection circuit including: a zener diode configured to generate a zener reference signal; and an operational amplifier coupled to the zener diode and configured to receive the zener reference signal and a feedback signal corresponding to an output current of the power supply system, and to generate the zero-crossing signal.

In some embodiments, an off-time of the gate control signal is based on the zero-crossing signal.

In some embodiments, a cathode of the zener diode is coupled to a positive input terminal of the operational amplifier, and a negative input terminal of the operational amplifier is coupled to a compare input of the PFC controller and is configured to receive the feedback signal.

In some embodiments, the zener diode is biased by the gate control signal output by the PFC controller.

In some embodiments, the zener reference signal is based on the gate control signal, and is configured to decay in response to the PFC controller being turned off.

In some embodiments, the power supply system further includes: a diode coupled between an output of the operational amplifier and the zero-crossing input of the PFC controller and configured to prevent a signal entering the zero-crossing input from being pulled down.

In some embodiments, the power supply system further includes: a low-pass filter configured to filter the gate control signal output by the PFC controller and to bias the zener diode with the filtered gate control signal.

In some embodiments, the PFC controller is configured to reduce a total harmonic distortion and increase a power factor of the power supply system.

In some embodiments, the power supply system further includes: a sense resistor coupled to an output of the power supply system and configured to measure an output signal of the power supply system.

In some embodiments, the power supply system further includes: an error amplifier configured to compare the output signal with an output reference signal and to generate the feedback signal, wherein the output reference signal is based on a brightness setting of a light source coupled to the power supply system.

In some embodiments, the power supply system further includes: an optocoupler coupled between the error amplifier and the operational amplifier and configured to communicate the feedback signal.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

The detailed description set forth below is intended as a description of example embodiments of power supply system including a zero crossing detection circuit coupled to a PFC controller, provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
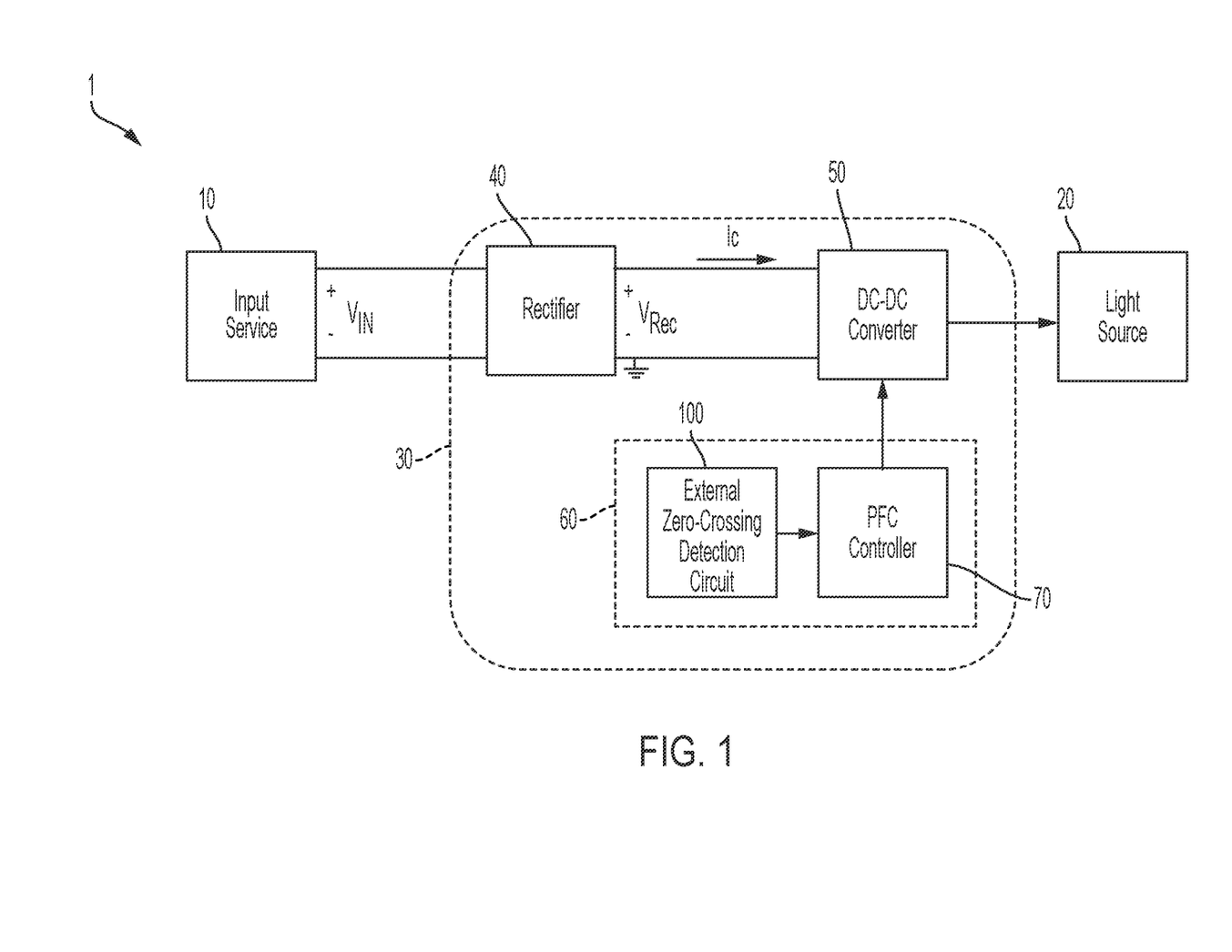
FIG. 1 illustrates a lighting system including a zero-crossing detection circuit coupled to a power-factor-correction (PFC) controller, according to some example embodiments of the present disclosure.

FIG. 1 illustrates a lighting system including a zero-crossing detection circuit coupled to a power-factor-correction (PFC) controller, according to some example embodiments of the present disclosure.

According to some embodiments, the lighting system 1 includes an input source 10, a light source 20, and a power supply system 30 (e.g., a switched-mode power supply with negative injection) for powering and controlling the brightness of the light source 20 based on the signal from the input source 10.

The input source 10 may include an alternating current (AC) power source that may operate at a 100 Vac (e.g., in Japan), 120 Vac (e.g., in the US), a 240 Vac (e.g., in Europe), or 277 Vac (e.g., in large industrial plants). The input source 10 may also include a dimmer electrically powered by said AC power sources. The dimmer may modify (e.g., cut/chop a portion of) the input AC signal according to a dimmer level before sending it to the power supply system 30, and thus variably reduces the electrical power delivered to the power supply system 30 and the light source 20. In some examples, the dimmer may be a TRIAC or ELV dimmer, and may chop the front end or leading edge of the AC input signal. According to some examples, the dimmer interface may be a rocker interface, a tap interface, a slide interface, a rotary interface, or the like. A user may adjust the dimmer level by, for example, adjusting a position of a dimmer lever or a rotation of a rotary dimmer knob, or the like. The light source 20 may include one or more light-emitting-diodes (LEDs) or an arc or gas discharge lamp with electronic ballasts, such as high intensity discharge (HID) or fluorescent lights.

In some embodiments, the power supply system 30 includes a rectifier 40, a converter (e.g., a DC-DC converter) 50, and a power factor correction (PFC) circuit 60.

The rectifier 40 provides a same polarity of output for either polarity of the AC signal from the input source 10. In some examples, the rectifier 40 may be a full-wave circuit using a center-tapped transformer, a full-wave bridge circuit with four diodes, a half-wave bridge circuit, or a multi-phase rectifier.

The converter 50 converts the rectified AC signal generated by the rectifier 40 into a drive signal for powering and controlling the brightness of the light source 20. The drive signal may depend on the type of the one or more LEDs of the light source 20. For example, when the one or more LEDs of the light source 20 are constant current LEDs the drive signal may be a variable voltage signal, and when the light source 20 requires constant voltage, the drive signal may be a variable current signal. In some embodiments, the converter 50 includes a boost converter for maintaining (or attempting to maintain) a constant DC bus voltage on its output while drawing a current that is in phase with and at the same frequency as the line voltage (by virtue of the PFC circuit 60). Another switched-mode converter (e.g., a transformer) inside the converter 50 produces the desired output voltage from the DC bus.

PFC circuit 60 improves (e.g., increases) the power factor of the load on the input source 10 and reduces the total harmonic distortions (THD) of the power supply system 30. As non-linear loads including the rectifier 40 and the converter 50 distort the current drawn from the input source 10, the PFC circuit 60 counteracts the distortion and raises the power factor. In some examples, other sources of current distortion may be input filter capacitors, input filter chokes, boost inductors, second stage transformers, and any non-linear elements or loads on the secondary side of a transformer inside the converter 50, which would be reflected over to the primary side of the transformer. Further, the main switch (e.g., the transistor) in the boost stage of the converter 50 may also distort the current if it is fed with a constant duty cycle or constant on-time. The PFC circuit 60 may be capable of counteracting current distortions regardless of the source.

According to some embodiments, the PFC circuit 60 includes a PFC controller (e.g., a current-mode PFC controller) 70 and a zero-crossing detection circuit 100. The PFC controller 70 controls the converter 50 to ensure that the input current IC to the converter 50 matches the waveform of the input voltage $V_{REC}$ generated by the rectifier 40. In so doing, the PFC controller 70 senses a current IC flowing through an inductor of the converter 50 (e.g., the inductor of the boost circuit), and compares this sensed current against the rectified input voltage $V_{REC}$. Based on this comparison, the PFC controller 70 generates a control signal that controls the on-off timing of a switching element in the converter 50 (e.g., the inductor of the boost circuit), which determines the shape of the input current waveform at the converter 50.

In some examples, the PFC controller 70 operates by comparing the sensed inductor current flowing through the converter 50 with the rectified input voltage, and controlling the main switch within the converter 50 according to a modulation scheme (e.g., by controlling the switching frequency, duty cycle, on-time or off-time, etc.) to obtain a desired output voltage for application to the light source 20.

In the related art, the PFC controller may control the activation/deactivation of the main switch of the converter 50 to lower or raise the switching frequency of the main switch, by varying the on-time, while utilizing a fixed off-time. As the converter 50 operates in discontinuous mode or boundary conduction mode, the current does not continuously flow through the inductor of the converter. Thus, the inductor current waveform may repeatedly reach zero during every cycle and the PFC controller 70 may send a turn on signal to the main switch to begin the next pulse of the inductor current once a current zero-crossing is detected.

According to some embodiments, the zero-crossing detection circuit 100, which is external to the PFC controller 70, allows the PFC controller 70 to have both a variable on-time, and a variable off-time, by applying a control signal to the PFC controller 70 (e.g., to a ZCS pin of the PFC controller 70). In some embodiments, depending on the desired output voltage for the converter 50, the zero-crossing detection circuit 100 maintains the PFC controller 70 at a particular state to prolong the off-time of the main switch of the converter 50 and thus lower the switching frequency of the main switch. This may allow a much wider output operating range for the power supply system 30, while still remaining within electromagnetic compliance (EMC) limits for power factor and total harmonic distortion.

Figure 2:
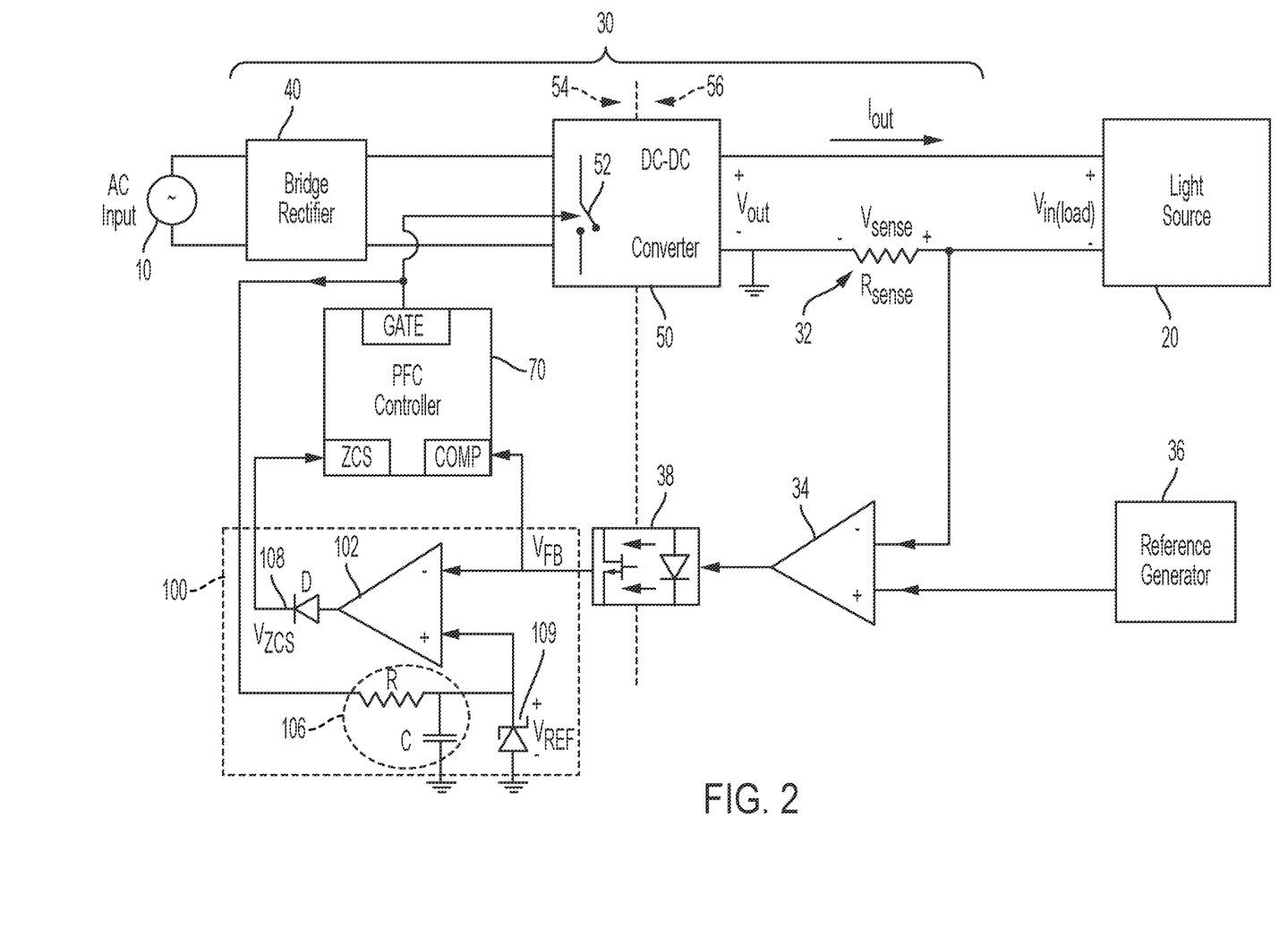
FIG. 2 is a block diagram illustrating a power supply system that includes a zero-crossing detection circuit for controlling the state of the PFC controller based on feedback from a secondary side of the power supply system, according to some embodiments of the present disclosure.

FIG. 2 is a block diagram illustrating a power supply system 30 that includes a zero-crossing detection circuit for controlling the state of the PFC controller 70 based on feedback from a secondary side of the power supply system 30, according to some embodiments of the present disclosure.

In some embodiments, the PFC controller 70 controls the on/off state of the main switch 52 of the converter 50, which may be a field effect transistor (FET), via a gate control signal $V_{GATE}$ supplied by a control output (e.g., a control output terminal/pin) GATE of the PFC controller 70. The on/off state of the main switch 52 controls the output voltage of the converter 50.

The PFC controller 70 also has a zero-crossing input (e.g., a zero-crossing input terminal/port/pin) ZCS, which, when held at a first state (e.g., held high), can deactivate (e.g., turn off) the PFC controller 70, and thus deactivate the main switch 52 and cause the output voltage $V_{OUT}$ of the converter 50 to drop. When the zero-crossing input ZCS is in a second state (e.g., is released or becomes open connection), the PFC controller 70 may resume normal operation and provide the control signal to the main switch 52 to regulate the output voltage $V_{OUT}$. In the related art, the PFC controller adjusts the switching frequency of the main switch 52 by varying the on-time of the gate control signal, while maintaining a fixed off-time for the gate control signal.

According to some embodiments, by selectively holding the zero-crossing input ZCS in the first state to turn off, or prolong the off-time of, the PFC controller 70, the zero-crossing detection circuit 100 can increase the off-time of the gate control signal $V_{GATE}$.

The PFC controller 70 may generate the gate control signal $V_{GATE}$ based on a feedback signal corresponding to the output voltage/current of the converter 50. In some embodiments, the power supply system 30 includes a feedback loop that include a sense resistor ($R_{sense}$) 32, a first operational amplifier (also referred to as an error amplifier) 34, a reference generator 36, and an optocoupler 38. The sense resistor 32 is coupled between the output of the converter 50 and the light source 20 and is connected electrically in series with the light source 20. The sense resistor 32 is also coupled to the error amplifier 34 (e.g., to a negative input terminal of the error amplifier 34). In some examples, the sense resistor 32 is about 0.1 Ω to about 2Ω.

The error amplifier 34 is configured to sense the voltage drop across the sense resistor 32 (also referred to as the sensed voltage $V_{sense}$), which is indicative of the output current of the converter 50, to compare the sensed voltage $V_{sense}$ with an output reference signal generated by the reference generator 36, and to generate a corresponding error/feedback signal.

According to some embodiments, the reference signal generated by the reference generator 36 is used to determine (e.g., set) the DC-signal level that the input voltage $V_{in}$ of the light source 20 is to be regulated to. In some examples, the reference generator 36 may provide a fixed/constant voltage to the first operational amplifier 34. However, embodiments of the present disclosure are not limited thereto. For example, in embodiments in which the input source 10 includes a dimmer, the reference generator 36 adjusts the output reference signal (e.g., the reference voltage/current) according to the intensity setting at the dimmer. In some embodiments, the lighting system 1 includes a dimmer controller (which may be incorporated into the power supply system 30) that controls/determines the reference signal (e.g., the reference signal level) based on a dimmer setting. In some examples, the reference generator 63 provides a reference signal to a second input terminal (e.g., the positive input terminal) of the first operational amplifier 34.

In some examples, the sense resistor 32, the first operational amplifier 34, and the reference generator 36 are electrically coupled to the secondary side 56 of the converter 50, and are electrically isolated from the primary side 54 of the converter 50, which is where the PFC controller 70 and the zero-crossing detection circuit 100 reside. The optocoupler 38 communicates the error signal generated by the first operational amplifier 34 on the secondary side 56 to the PFC controller 70 and the zero-crossing detection circuit 100 on the primary side 54, while maintaining the electrical isolation between the two sides.

The PFC controller 70 utilizes the error/feedback signal $V_{FB}$, which is received at the compare input (e.g., compare input terminal/port/pin) COMP of the PFC controller 70 to perform power factor correction by generating an appropriate gate control signal $V_{GATE}$ at the gate control output (e.g., gate control output terminal/port/pin) GATE of the PFC controller 70. The error/feedback signal $V_{FB}$ is also received by the zero-crossing detection circuit 100 and used to turn off the PFC controller 70 when appropriate.

In some embodiments, the zero-crossing detection circuit 100 includes a second operational amplifier 102 configured to receive the error/feedback signal $V_{FB}$ (e.g., at its negative input terminal), to compare this signal with a zener reference signal (e.g., a zener reference voltage) $V_{REF}$ generated by a zener diode 104 (which may be coupled to the positive input terminal of the second operational amplifier 102), and to generate a zero-crossing signal for application to the zero-crossing input of the PFC controller 70. The zener diode 104 is electrically biased by the same gate control signal $V_{GATE}$ used to control the main switch 52. As the gate control signal $V_{GATE}$ is time variant (e.g., pulsed), the zero-crossing detection circuit 100 may further include a low pass filter (e.g., an RC filter) 106 to filter the gate control signal $V_{GATE}$ before applying it as a bias to the zener diode 104.

According to some embodiments, when the sensed current at the output of the converter 50 is higher than the desired current (e.g., higher than the reference signal level), the feedback signal $V_{FB}$ generated by the first operational amplifier 34 may decrease. When the feedback signal $V_{FB}$ at the second operational amplifier 102 falls below the zener reference voltage $V_{REF}$, the output of the second operational amplifier 102, and thus the voltage applied to the zero-crossing input ZCS may increase to a high value (e.g., about 1.4 V or higher). This in turn causes the PFC controller 70 to turn off. As long as the zero-crossing input ZCS is held at the high value, the PFC controller 70 and the gate control signal $V_{GATE}$ stay off. This increase in the off-time of the fate control signal reduces the frequency of switching of the converter 50 and prevents the converter 50 from delivering power to the light source 20, which lowers the voltage output and/or current output of the converter 50.

Holding the zero-crossing input ZCS high indefinitely may cause the driver to remain off without being able to turn back on. However, as the bias of the reference zener diode 104 is dependent on the gate control signal pulses, turning the PFC controller 70 off may result in no bias for the reference zener diode 104. Without a bias, the zener diode voltage decays and causes the zener reference voltage $V_{REF}$ at the positive input of the second operational amplifier 102 to drop over time. The output of the second operational amplifier 102 may change to a low value (e.g., 0 V or a negative voltage) once the reference zener voltage $V_{REF}$ falls below the level of the feedback signal $V_{FB}$. At that point, the zero-crossing input ZCS is released, and the PFC controller 70 turns on and can resume normal operation by sending a pulse from the gate control output GATE to the converter 50. Therefore, because the reference zener diode 104 is biased with the gate control signal $V_{GATE}$ (which goes low when the PFC controller 70 is turned off), it is ensured that PFC controller does not remain off indefinitely. In some examples, the zener reference voltage $V_{REF}$ may range from about 1.2 V to about 2.0 V.

The delay between when the PFC controller 70 is turned off and when the it turns back on as a result of the decay of the reference zener voltage $V_{REF}$ determines (e.g., is equal to) the off-time of the gate control signal $V_{GATE}$. As this delay is determined based on the sensed voltage $V_{sense}$ and the output reference signal at the input of the 34, the off-time of the gate control signal $V_{GATE}$ may be variable. For example, for a given output reference signal (e.g. a given brightness setting), the off-time of the gate control signal $V_{GATE}$ may be variably based on the sensed voltage $V_{sense}$. In some examples, the off-time may be about 10 μs to about 50 μs.

In some embodiments, the output signal of the second operational amplifier 102 is fed through a diode 108 to the zero-crossing input ZCS. The diode 108 may prevent the signal entering the zero-crossing input ZCS from being pulled down as the current through the diode 108 may only flow in one direction, thus preventing the zero-crossing detection circuit 100 from interfering with the operation of the PFC controller 70 under normal operating conditions.

In some embodiments, when the sensed current at the output of the converter 50 is lower than the desired current (e.g., lower than the reference signal level), the feedback signal generated by the first operational amplifier 34 may increase. When the feedback signal at the second operational amplifier 102 rises above the zener reference voltage $V_{REF}$, the output of the second operational amplifier 102 may fall to a low value. This causes the zero-crossing input ZCS of the PFC controller 70 to be released, by virtue of the diode 108, which turns on the PFC controller 70 and allows it to drive the converter 50 to increase its output voltage/current.

Figure 3A:
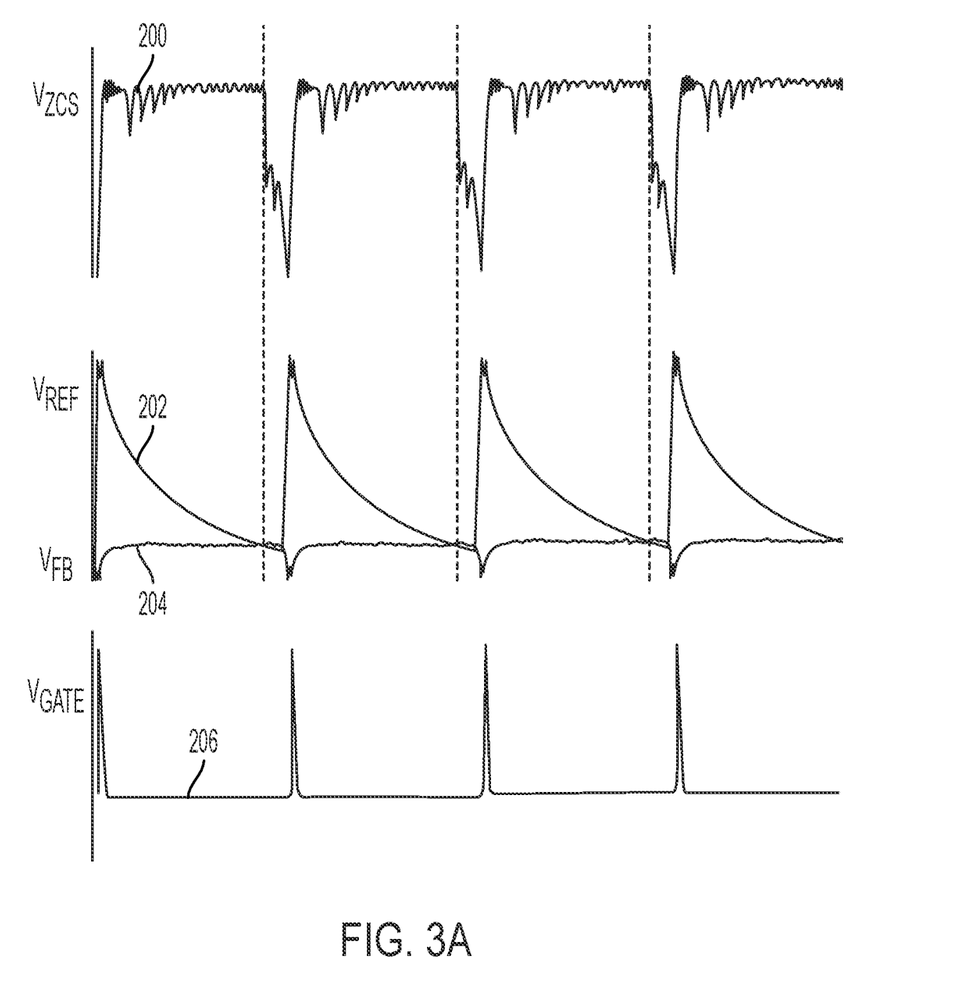
FIGS. 3A and 3B are waveforms illustrating the operation of the zero-crossing detection circuit in low load conditions and high load condition, respectively, according to some embodiments of the present disclosure.
Figure 3B:
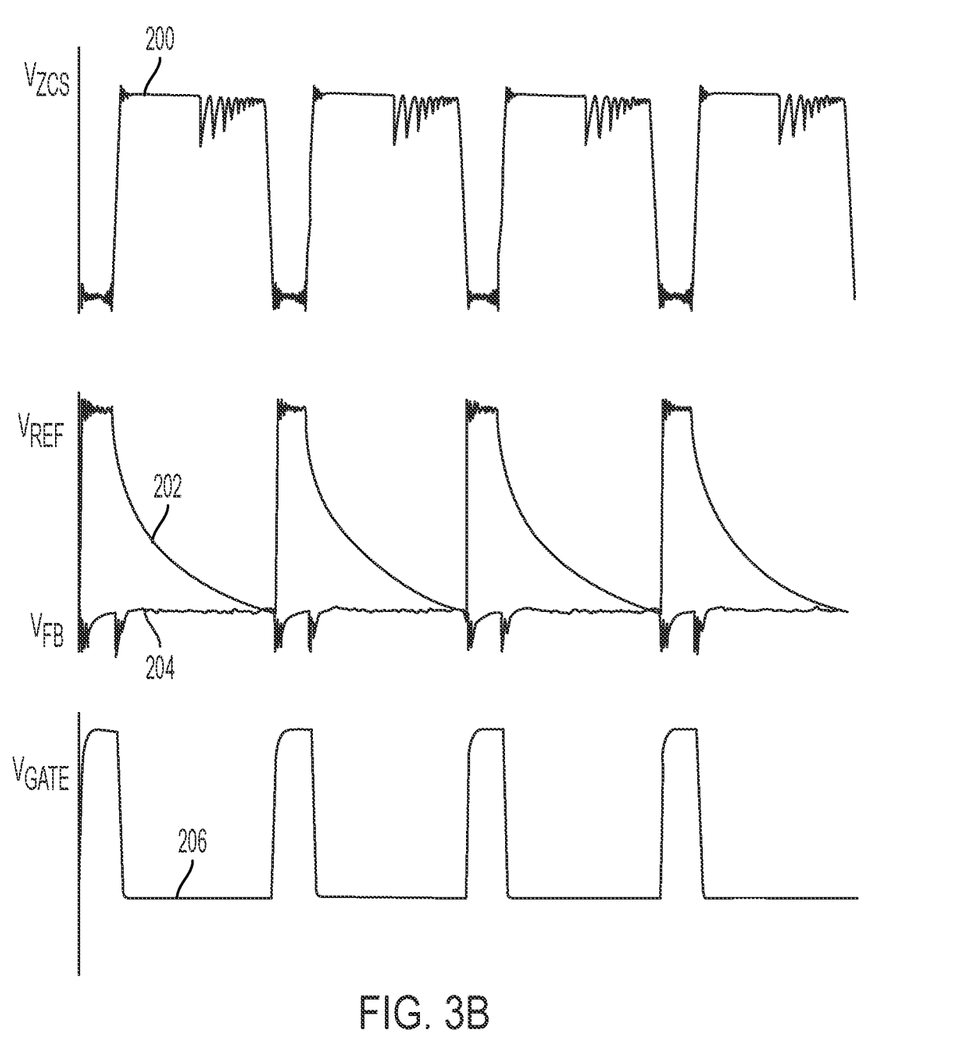

FIGS. 3A and 3B are waveforms illustrating the operation of the zero-crossing detection circuit 100 in low load conditions and high load condition, respectively, according to some embodiments of the present disclosure.

Referring to FIGS. 3A and 3B, in both light load conditions (e.g., when $I_{OUT}$ is small) and in high load conditions (e.g., when $I_{OUT}$ is large), the voltage ($V_{ZCS}$) 200 at the zero-crossing input ZCS of the PFC controller 70 is held high while the zener reference voltage ($V_{REF}$) 202 is higher than the feedback signal ($V_{FB}$) 204, and is released and goes low once the zener reference voltage ($V_{REF}$) 202 becomes lower than the feedback signal ($V_{FB}$) 204 from the secondary side 56. Here, the zener reference voltage ($V_{REF}$) 202 begins to decay once the gate control signal $V_{GATE}$ is released/turned off.

In high-load conditions, the on-time of the gate control signal is higher than during low-load states so as to provide higher load currents that are needed. As such, the zero-crossing detection circuit 100 holds the zero-crossing input high for a longer period during high-load conditions than low-load conditions. For example, at low loads (see, FIG. 3A), the zero-crossing input ZCS may be held high for about 45.4 μs, and at high loads (see, FIG. 3B), the may be held high for about 27.4 μs. As shown in FIG. 3B, under high-load conditions, the zero-crossing detection circuit 100 essentially does not function, since there is no need to an artificially long off-time. This is exhibited by the next gate signal $V_{GATE}$ fires almost immediately when the zero-crossing input voltage $V_{ZCS}$ has a falling edge on the high load condition. In contrast, as shown in FIG. 3A, under the low load condition, there is a delay between the falling edge of the zero-crossing input voltage $V_{ZCS}$, and the next gate firing signal $V_{GATE}$.

As described above, the zero-crossing detection circuit 100 utilizes the signal provided to the zero-crossing input of the PFC controller 70 to determine when the main switch 52 of the converter 50 can be turned on to begin the next pulse of the inductor current of the converter 50. In some embodiments, the zero-crossing detection circuit 100 allows for a variable off-time and variable on-time, rather than just a variable on-time and fixed off-time, as in the related art. The gate control signal from the PFC controller 70 is utilized to synchronize a control signal applied to the zero-crossing input of the PFC controller to ensure that the power supply system 30 does not latch off. Further, the zero-crossing detection circuit 100 lowers the frequency of the power supply system 30 when it is desired to drive to lower output voltages. The zero-crossing signal applied to the zero-crossing input of the PFC controller 70 effectively places a clamp on the frequency of the power supply system 30, thus allowing the power supply system 30 to have a wide-ranging output. This may also result in improved EMI performance at low power due to maintaining the frequency low with longer off-times.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept". Also, the term "exemplary" is intended to refer to an example or illustration.

As used herein, the terms "use", "using", and "used" may be considered synonymous with the terms "utilize", "utilizing", and "utilized", respectively.

The power supply system with the zero-crossing detection circuitry and/or any other relevant devices or components according to embodiments of the present invention described herein may be implemented by utilizing any suitable hardware, firmware (e.g., an application-specific integrated circuit), software, or a suitable combination of software, firmware, and hardware. For example, the various components of the independent multi-source display device may be formed on one integrated circuit (IC) chip or on separate IC chips. Further, the various components of the LED driver may be implemented on a flexible printed circuit film, a tape carrier package (TCP), a printed circuit board (PCB), or formed on the same substrate. Further, the various components of the LED driver may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer-readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A zero-crossing detection circuit coupled to a power factor correction (PFC) controller of a power supply system, the zero-crossing detection circuit comprising:
   a zener diode configured to generate a zener reference signal; and
   an operational amplifier coupled to the zener diode and having an input terminal directly coupled to the PFC controller, the operational amplifier being configured to receive the zener reference signal and a feedback signal corresponding to an output current of the power supply system, and to generate a zero-crossing signal for transmission to a zero-crossing input of the PFC controller, the zero-crossing signal being configured to variably control an off-time of the PFC controller,
   wherein the PFC controller is configured to reduce a total harmonic distortion (THD) of the power supply system.

2. The zero-crossing detection circuit of claim 1, wherein a cathode of the zener diode is coupled to a positive input terminal of the operational amplifier, and
   wherein a negative input terminal of the operational amplifier is configured to receive the feedback signal.

3. The zero-crossing detection circuit of claim 1, wherein a negative input terminal of the operational amplifier is coupled to a compare input of the PFC controller.

4. The zero-crossing detection circuit of claim 1, wherein the zener diode is biased by a gate control signal output by the PFC controller, and
   wherein an off-time of the gate control signal is based on the zero-crossing signal.

5. The zero-crossing detection circuit of claim 1, wherein the zener reference signal is based on a gate control signal output by the PFC controller.

6. The zero-crossing detection circuit of claim 1, wherein the zener reference signal is configured to decay in response to the PFC controller being turned off.

7. The zero-crossing detection circuit of claim 1, further comprising:
   a diode coupled between an output of the operational amplifier and the zero-crossing input of the PFC controller and configured to prevent a signal entering the zero-crossing input from being pulled down.

8. The zero-crossing detection circuit of claim 1, further comprising:
   a low-pass filter configured to filter a gate control signal output by the PFC controller and to bias the zener diode with the filtered gate control signal.

9. The zero-crossing detection circuit of claim 1, wherein the feedback signal is based on the output current of the power supply system and a brightness setting of a light source coupled to the power supply system.

10. A power supply system comprising:
    a power factor correction (PFC) controller comprising a zero-crossing input, and configured to generate a gate control signal based on a zero-crossing signal received at the zero-crossing input to reduce a total harmonic distortion (THD) of the power supply system; and
    a zero-crossing detection circuit coupled to the PFC controller, the zero-crossing detection circuit comprising:
       a zener diode configured to generate a zener reference signal; and
       an operational amplifier coupled to the zener diode and having an input terminal directly coupled to the PFC controller, the operational amplifier being configured to receive the zener reference signal and a feedback signal corresponding to an output current of the power supply system, and to generate the zero-crossing signal to variably control an off-time of the PFC controller.

11. The power supply system of claim 10, wherein an off-time of the gate control signal is based on the zero-crossing signal.

12. The power supply system of claim 10, wherein a cathode of the zener diode is coupled to a positive input terminal of the operational amplifier, and
wherein a negative input terminal of the operational amplifier is coupled to a compare input of the PFC controller and is configured to receive the feedback signal.

13. The power supply system of claim 10, wherein the zener diode is biased by the gate control signal output by the PFC controller.

14. The power supply system of claim 10, wherein the zener reference signal is based on the gate control signal, and is configured to decay in response to the PFC controller being turned off.

15. The power supply system of claim 10, further comprising:
a diode coupled between an output of the operational amplifier and the zero-crossing input of the PFC controller and configured to prevent a signal entering the zero-crossing input from being pulled down.

16. The power supply system of claim 10, further comprising:
a low-pass filter configured to filter the gate control signal output by the PFC controller and to bias the zener diode with the filtered gate control signal.

17. The power supply system of claim 10, wherein the PFC controller is configured to reduce the total harmonic distortion and increase a power factor of the power supply system.

18. The power supply system of claim 10, further comprising:
a sense resistor coupled to an output of the power supply system and configured to measure an output signal of the power supply system.

19. The power supply system of claim 18, further comprising:
an error amplifier configured to compare the output signal with an output reference signal and to generate the feedback signal,
wherein the output reference signal is based on a brightness setting of a light source coupled to the power supply system.

20. The power supply system of claim 19, further comprising:
an optocoupler coupled between the error amplifier and the operational amplifier and configured to communicate the feedback signal.

* * * * *